(12) United States Patent
Colburn et al.

(10) Patent No.: US 7,407,554 B2
(45) Date of Patent: Aug. 5, 2008

(54) DEVELOPMENT OR REMOVAL OF BLOCK COPOLYMER OR PMMA-B-S-BASED RESIST USING POLAR SUPERCRITICAL SOLVENT

(75) Inventors: Matthew E. Colburn, Hopewell Junction, NY (US); Dmitriy Shneyder, Hopewell Junction, NY (US); Shahab Siddiqui, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 480 days.

(21) Appl. No.: 10/907,688

(22) Filed: Apr. 12, 2005

(65) Prior Publication Data

US 2006/0228653 A1 Oct. 12, 2006

(51) Int. Cl.
*B08B 7/04* (2006.01)
*G03F 7/34* (2006.01)

(52) U.S. Cl. ........................................ 134/37; 430/322
(58) Field of Classification Search .................... 134/37; 430/322
See application file for complete search history.

(56) References Cited

U.S. PATENT DOCUMENTS

| | | | |
|---|---|---|---|
| 5,236,602 A * | 8/1993 | Jackson | 210/748 |
| 5,665,527 A | 9/1997 | Allen et al. | |
| 5,908,510 A | 6/1999 | McCullough et al. | |
| 5,976,264 A | 11/1999 | McCullough et al. | |
| 6,277,753 B1 | 8/2001 | Mullee et al. | |
| 6,306,564 B1 | 10/2001 | Mullee | |
| 6,331,487 B2 | 12/2001 | Koch | |
| 6,346,484 B1 | 2/2002 | Cotte et al. | |
| 6,358,673 B1 | 3/2002 | Namatsu | |
| 6,379,874 B1 | 4/2002 | Ober et al. | |
| 6,398,875 B1 | 6/2002 | Cotte et al. | |
| 6,425,956 B1 | 7/2002 | Cotte et al. | |
| 6,451,375 B1 | 9/2002 | Cotte et al. | |
| 6,454,869 B1 | 9/2002 | Cotte et al. | |
| 6,500,605 B1 | 12/2002 | Mullee et al. | |
| 6,509,136 B1 | 1/2003 | Goldfarb et al. | |
| 6,509,141 B2 | 1/2003 | Mullee | |
| 6,521,466 B1 | 2/2003 | Castrucci | |
| 6,558,475 B1 | 5/2003 | Jur et al. | |
| 6,561,220 B2 | 5/2003 | McCullough et al. | |
| 6,562,146 B1 | 5/2003 | DeYoung et al. | |
| 6,579,464 B2 | 6/2003 | Cotte et al. | |
| 6,622,507 B2 | 9/2003 | Cotte et al. | |
| 6,641,678 B2 | 11/2003 | DeYoung et al. | |
| 6,653,233 B2 | 11/2003 | Cotte et al. | |
| 6,656,666 B2 | 12/2003 | Simons et al. | |
| 6,673,521 B2 | 1/2004 | Moreau et al. | |
| 6,683,008 B1 | 1/2004 | Cotte et al. | |
| 6,736,906 B2 | 5/2004 | Cotte et al. | |
| 6,739,346 B2 | 5/2004 | Cotte et al. | |
| 6,821,488 B1 | 11/2004 | McCullough et al. | |
| 6,838,015 B2 | 1/2005 | Cotte et al. | |
| 6,875,286 B2 | 4/2005 | Cotte et al. | |
| 2002/0012884 A1 | 1/2002 | Gleason et al. | |
| 2003/0047533 A1 * | 3/2003 | Reid et al. | 216/24 |
| 2003/0091935 A1 | 5/2003 | Gleason et al. | |

OTHER PUBLICATIONS

U.S. Appl. No. 09/893,207, filed Jun. 27, 2001, "Process of Removing Residue Material From a Precision Surface".
U.S. Appl. No. 09/893,104, filed Jun. 27, 2001, "Dielectric Material And Process Of Insulating a Semiconductor Device Using Same".
U.S. Appl. No. 10/318,632, filed Dec. 13, 2002, "Apparatus and Method For the Rapid Thermal Control of a Work Piece In Liquid or Supercritical Fluid".
U.S. Appl. No. 10/124,842, filed Apr. 18, 2002, "Process and Apparatus for Contacting a Precision Surface with Liquid or Supercritical Carbon Dioxide".
U.S. Appl. No. 10/320,834, filed Dec. 16, 2002, "Method to Build a Microfilter".
U.S. Appl. No. 10/320,835, filed Dec. 16, 2002, "Method of Insitu Monitoring of Supercritical Fluid Process Conditions".
Black, C. T., et al., "High-Capacity, Self-Assembled Metal-Oxide-Semiconductor Decoupling Capacitors," IEEE Electron Device Letters, Jun. 2004, pp. 1-3.
Guarini, K. W., et al., "Nanoscale Patterning Using Self-Assembled Polymers for Semiconductor Applications," Journal of Vacuum Science Technology B, vol. 19, No. 6, Nov./Dec. 2001, pp. 2784-2788.
Black, C. T., et al., "Integration of Self-Assembled Diblock Copolymers for Semiconductor Capacitor Fabrication," Applied Physics Letters, vol. 79, No. 3, Jul. 2001, pp. 409-411.

(Continued)

*Primary Examiner*—Hoa V Le
(74) *Attorney, Agent, or Firm*—Joseph Petrokaitis; Hoffman Warnick LLC

(57) ABSTRACT

Methods of developing or removing a select region of block copolymer films using a polar supercritical solvent to dissolve a select portion are disclosed. In one embodiment, the polar supercritical solvent includes chlorodifluoromethane, which may be exposed to the block copolymer film using supercritical carbon dioxide ($CO_2$) as a carrier or chlorodiflouromethane itself in supercritical form. The invention also includes a method of forming a nano-structure including exposing a polymeric film to a polar supercritical solvent to develop at least a portion of the polymeric film. The invention also includes a method of removing a poly(methyl methacrylate-b-styrene) (PMMA-b-S) based resist using a polar supercritical solvent.

12 Claims, 5 Drawing Sheets

OTHER PUBLICATIONS

Schäffer, E. et al., "Electrically Induced Structure Formation and Pattern Transfer," Macmillan Magazines Ltd., Letters to Nature, vol. 403, Feb. 24, 2000, pp. 874-877.

Thurn-Albrecht, T., et al., "Ultrahigh-Density Nanowire Arrays Grown in Self-Assembled Diblock Copolymer Templates," Science Magazine, vol. 290, Dec. 15, 2000, pp. 2126-2129.

U.S. Appl. No. 10/695,374, filed Oct. 28, 2003, "Process For Removing Impurities From Low Dielectric Constant Films Disposed On Semiconductor Devices".

* cited by examiner

DEVELOPMENT OR REMOVAL OF BLOCK COPOLYMER OR PMMA-B-S-BASED RESIST USING POLAR SUPERCRITICAL SOLVENT

BACKGROUND OF THE INVENTION

1. Technical Field

The present invention relates generally to semiconductor fabrication, and more particularly, to methods for supercritical development or removal of block copolymer for patterning applications. In addition, the invention relates to removal of poly(methyl methacrylate-b-styrene) (PMMA-b-S) based resists using a polar supercritical solvent.

2. Related Art

The use of bottom-up approaches to semiconductor fabrication has grown in interest within the semiconductor industry. One such approach utilizes block copolymers for generating sub-optical ground rule patterns. In particular, one illustrative use is forming a 'honeycomb' structure with in a poly(methyl methacrylate-b-styrene) (PMMA-b-S) block copolymer. In the case of a cylindrical phase diblock having a minor component of PMMA-b-S, the PMMA-b-S block can phase separately to form vertically oriented cylinders within the matrix of the polystyrene block upon thermal anneal.

FIGS. 1A-C show the above-identified approach. FIG. 1A shows a substrate 10 coated (optionally) with a random copolymer 12, which is affixed to the surface. A block copolymer 14 is then coated on the top surface of the stack, as also shown in FIG. 1A. Block copolymer 14 is annealed with heat allowing for phase separation of the immiscible polymer blocks 18 and 20, as shown in FIG. 1B. As shown in FIG. 1C, the annealed film is then developed (perhaps augmented by using actinic irradiation) to reveal a pattern 30 that is commensurate with the positioning of one of the blocks in the copolymer. For simplicity, the block is shown as completely removed although this is not required.

Since block copolymers have a natural length scale associated with their molecular weight and composition, the morphology of a phase-separated block copolymer can be tuned to generate cylinders of a specific width and on a specific pitch. In one approach, ultraviolet (UV) exposure is used to cause the PMMA to decompose (and polystyrene to crosslink) into smaller molecules and, further, developed using glacial acetic acid to remove the small molecules. In other approaches, development simply uses the acetic acid to reveal the pattern.

For most applications, and in particular bottom-up semiconductor fabrication methodologies, the pattern must be transferred to a substrate. FIGS. 2A-B show a representative procedure in which a substrate 40 and a dielectric material 42 deposited upon it are (optionally) coated with a random copolymer 44, which is affixed to the surface. As shown in FIG. 2A, a block copolymer film 46 is coated on the top surface of the stack, annealed with heat allowing for phase separation of the immiscible polymer blocks, and developed to reveal a pattern having one block 48 remaining as a mask and voids 50 commensurate with the position of a second block of copolymer film 46. Again, for simplicity, the block is shown as completely removed although this is not required. This patterned copolymer film 46 is then used as a mask to transfer into underlying dielectric material 42. As shown in FIG. 2B, the resulting patterned dielectric material 52 is commensurate with the original pattern in copolymer film 46. This type of pattern has been shown, when applied to cylindrical phase PMMA-b-S, to allow for increased surface area, which increases capacitance in storage applications as well as provides 'quantized' wells for flash memory.

While these approaches demonstrate the capability of bottom-up fabrication, there are challenges with respect to implementation in a conventional semiconductor fabrication facility. One challenge relative to the implementation of this particular diblock copolymer is the development of PMMA-b-S without damaging a surrounding matrix while maintaining manufacturing compatible processes. In particular, the conventional approaches use glacial acetic acid to remove the PMMA-b-S using batch processing or liquid coating. Glacial acetic acid implementation requires specialized tooling in order to handle its flammability and corrosiveness. In other approaches, isopropyl alcohol (IPA) is utilized to develop PMMA-b-S e-beam resist. Unfortunately, IPA is not sufficient to remove an unexposed PMMA-b-S film having molecular weights and compositions of interest for semiconductor fabrication. Additionally, in some circumstances a 25 $J/cm^2$ UV exposure is used to develop the block copolymer, which is roughly 1000 times greater than that used for conventional resist.

Another challenge in the semiconductor industry is removing PMMA-b-S-based resist. In particular, plasma stripping of PMMA-b-S-based resist can damage porous interlayer dielectrics in certain integration schemes.

In view of the foregoing, there is a need in the art for methods of developing and/or removing select regions of block copolymers that do not suffer from the problems of the related art. In addition, there is a need in the art for a method of removing PMMA-b-S-based resist without damaging porous interlayer dielectrics.

SUMMARY OF THE INVENTION

The invention includes methods of developing and/or removing select regions of block copolymer films using a polar supercritical solvent. In one embodiment, the polar supercritical solvent includes chlorodifluoromethane, which may be exposed to the block copolymer film using supercritical carbon dioxide ($CO_2$) as a carrier or chlorodiflouromethane itself in supercritical form. The invention also includes a method of forming a nano-structure including exposing a polymeric film to a polar supercritical solvent to develop at least a portion of the polymeric film. The invention also includes a method of removing a poly(methyl methacrylate-b-styrene) (PMMA-b-S)-based resist using a polar supercritical solvent.

A first aspect of the invention is related to a method of removing a select portion of a block copolymer, the method comprising the steps of: exposing the block copolymer to a polar supercritical solvent to dissolve the select portion of the block copolymer; and removing the dissolved portion of the block copolymer.

A second aspect of the invention is directed to a method of forming a nano-structure, the method comprising the steps of: forming a polymeric film over a substrate; annealing the polymeric film to allow for phase separation of immiscible components; and exposing the polymeric film to a polar supercritical solvent to develop at least a portion of the polymeric film into the nano-structure.

A third aspect of the invention is directed to a method of developing a block copolymer in a semiconductor fabrication process, the method comprising the steps of: forming a block copolymer film upon a surface; and exposing the block copolymer film to a polar supercritical solvent to develop the block copolymer.

A fourth aspect of the invention includes a method of removing a poly(methyl methacrylate-b-styrene) (PMMA-b-S)-based resist, the method comprising the steps of: providing a partially fabricated semiconductor device including a porous dielectric and having the PMMA-b-S-based resist over at least a portion of the partially fabricated semiconductor device; and using a polar supercritical solvent to remove the PMMA-b-S-based resist.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 3A:
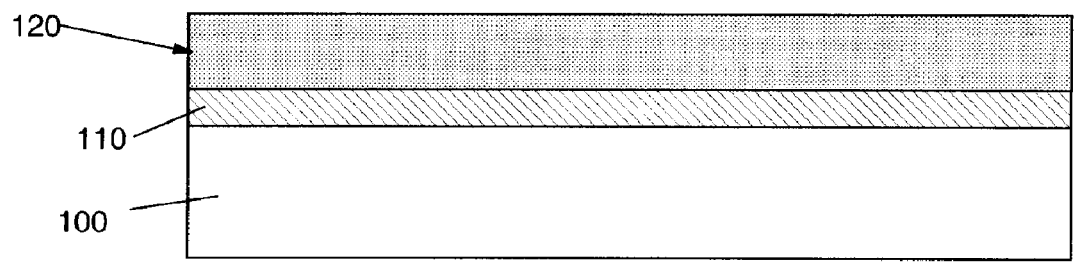
FIGS. 3A-C show a method of forming a nano-structure incorporating a method of developing and/or removing a block copolymer according to the invention.
Figure 3B:
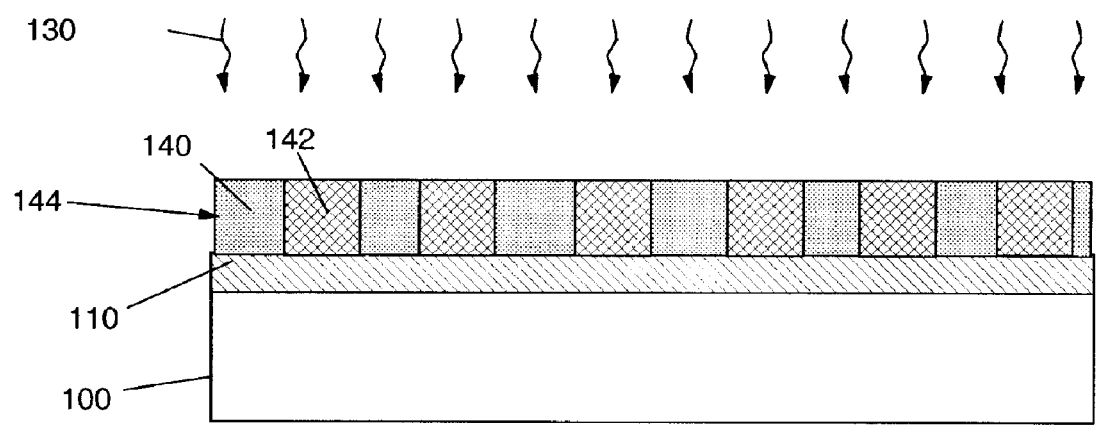
Figure 3C:
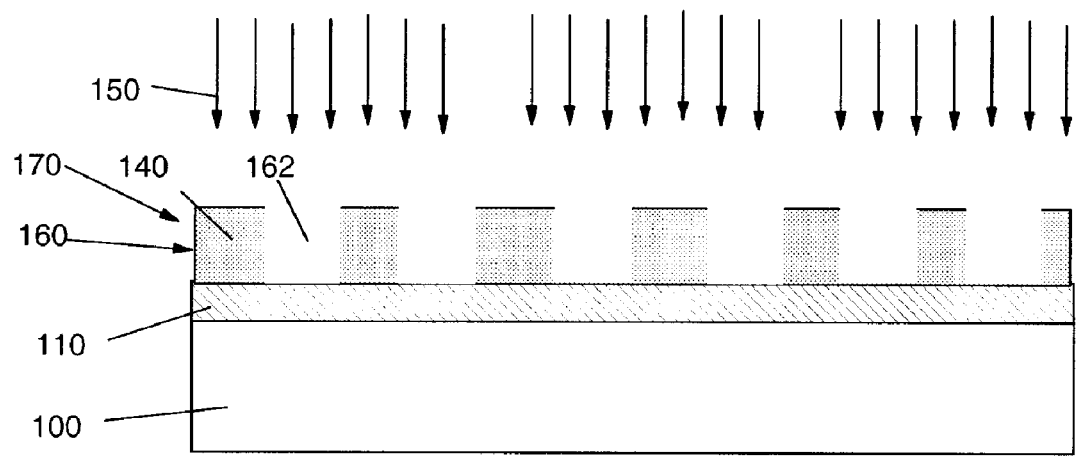

With reference to the accompanying drawing, FIGS. 3A-C show a method of forming a nano-structure incorporating a method of developing and/or removing a select portion of a block copolymer according to the invention. As used herein, "develop" means formation of patterns, and "remove" means taking out material from a film or other structure.

Figure 1A:
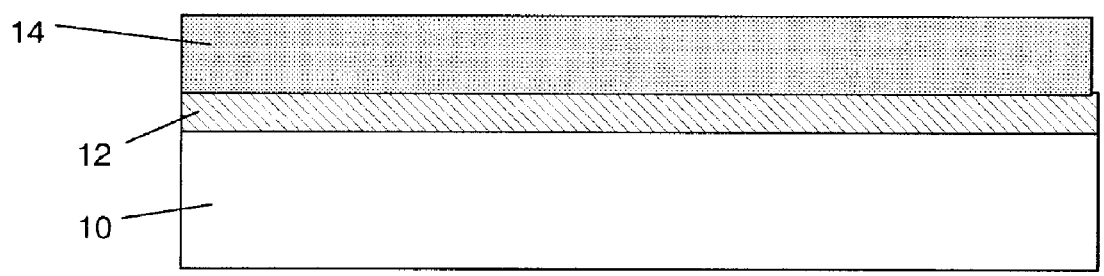
FIGS. 1A-C show the formation of a diblock copolymer according to a prior art approach.
Figure 1B:
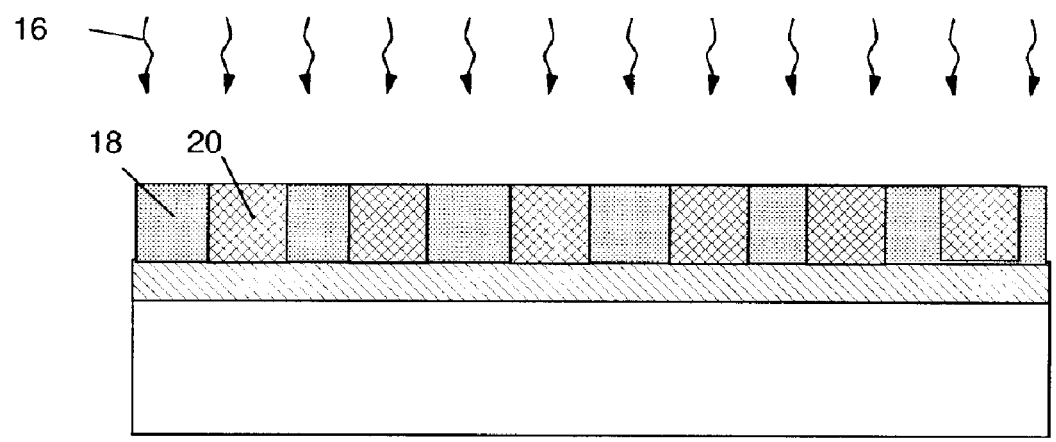
Figure 1C:
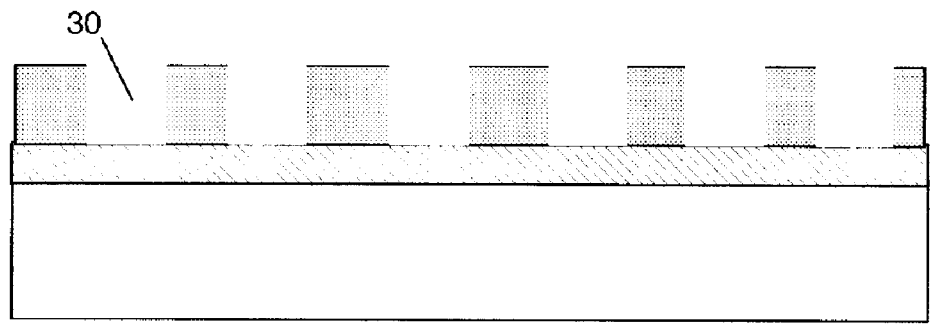
Figure 2A:
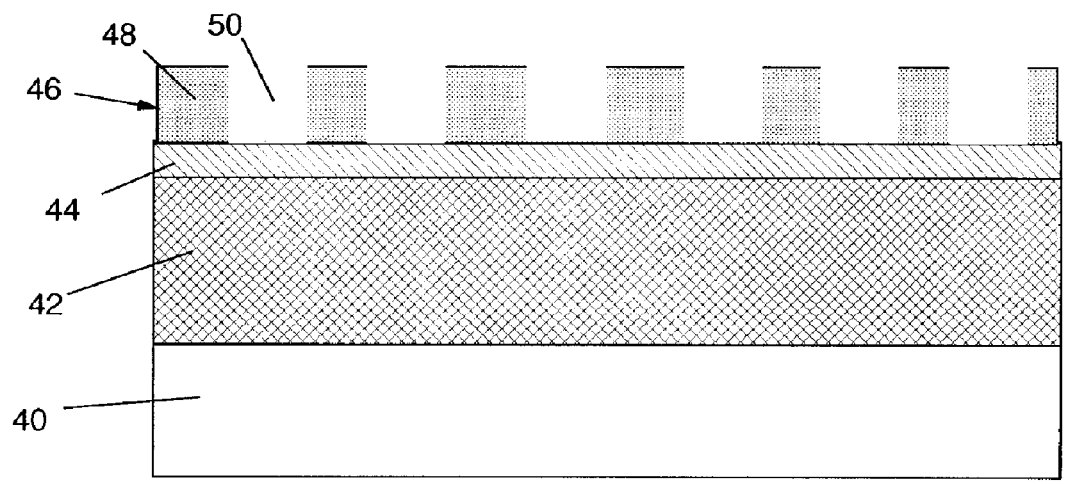
FIGS. 2A-B show the transfer of a diblock copolymer pattern into a substrate according to a prior art approach.
Figure 2B:
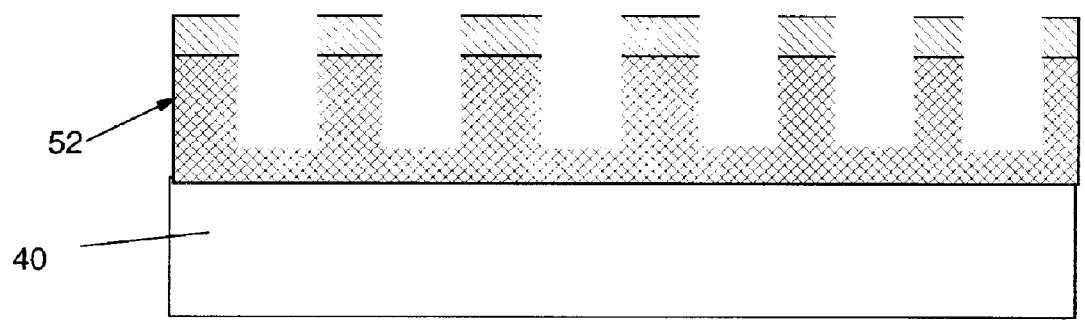

As shown in FIG. 3A, a first optional step includes coating a substrate 100 with a random copolymer 110. "Random copolymers" include macromolecules in which the probability of finding a given monomeric unit at a given site in the chain is independent of the nature of the adjacent unit. Random copolymers are called random because the sequence distribution of monomeric units follows is somewhat random, i.e., they do not have an ordered form like diblock copolymer. For example, styrene monomer does not have to repeat with methyl methycrylate, it could be styrene itself. Random copolymer 110 is affixed to a surface of substrate 100 and excess material is removed. A polymeric film 120, preferably a block copolymer, is then formed over substrate 100 and random copolymer 110, i.e., over the stack. Substrate 100 may include a variety of materials such as silicon, dielectric materials, etc. As used herein, a "block copolymer" is any polymeric material including immiscible components used to generate a pattern on a substrate whereby the pattern is not defined by a projected aerial image, i.e., irradiation is not required for use. In one embodiment, block copolymer 120 includes polystyrene, poly(methyl methacrylate-b-styrene) (PMMA-b-S) or blends thereof or any other block copolymers or polymeric blend capable of phase separation. In an alternative embodiment, block copolymer 120 includes a diblock copolymer, i.e., having a molecule including two immiscible polymer blocks A and B covalently bonded at one end such as polystyrene and PMMA-b-S. In another embodiment, a portion of block copolymer 120 may be crosslinked. Block copolymer 120 may be used to transfer the pattern onto a lower layer, as described above relative to FIG. 2B.

As shown in FIG. 3B, block copolymer 120 (FIG. 3A) is then annealed 130 to form annealed block copolymer film 144, and allow for phase separation of immiscible components of block copolymer 120 into blocks 140 and 142 (block 142 being referred to hereafter as "developed block 142"). Exposure to actinic irradiation to develop block copolymer 120 may offer certain benefits such as cross linking the polystyrene while 'breaking' PMMA-b-S polymer chains; hence, enhancing solubility properties further once exposed to supercritical polar solvents.

As shown in FIG. 3C, annealed block copolymer film 144 is then developed by exposing it to a polar supercritical solvent 150 to reveal a pattern 160. This step dissolves a select portion, i.e., developed block 142 (FIG. 3B), of block copolymer 120 (FIG. 3B), which is made into soluble PMMA-b-S by the polar supercritical solvent. As used herein, "supercritical" means that the solvent is able to sustain a chain reaction in such a manner that the rate of reaction increases, or increases the solubility properties of a solvent due to increase in density at or above the critical temperature and pressure. In one embodiment, polar supercritical solvent 150 may include at least one of: chlorodifluoromethane, methylene chloride, 1,1 dichloroehylene, ethylene dichloride, chloroform, 1,1 dichloroethane, trichloroethylene, chlorobenzene, O-dichlorobenzene, tetrahydrofuran, dibenzyl ether, acetone, methyl ethyl ketone, cyclohexanone, diethyl ketone, acetophenone, methyl isoamyl ketone, isophorone, methyl acetate, ethyl formate, ethyl acetate, diethyl carbonate, diethyl sulfate, 2-ethoxyethyl acetate, 2-nitropropane, nitrobenzene, pyridine, morpholine, analine, N-methyl-2-phyrrolidone and cyclohexylamine. In one preferred embodiment, polar supercritical solvent 150 includes chlorodifluoromethane. In this case, the exposing step preferably occurs at a temperature of greater than approximately 96.4° C. and a pressure greater than approximately 48.5 bars. Polar supercritical solvent 150 may also contain an optional co-solvent such as ethanol or methanol. In one embodiment, this step may include using supercritical carbon dioxide ($CO_2$) as a carrier for the polar supercritical solvent 150, but this is not necessary.

The exposing step, shown in FIG. 3C, may also include tuning polar supercritical solvent 150 to dissolve block 142 (FIG. 3B), i.e., tuning the supercritical polar solvent and the process environment. For example, in one embodiment, the exposing occurs in an environment at a temperature of no less than approximately 31° C. and no greater than approximately 80° C., and a pressure of no less than approximately 200 bar and no greater than approximately 300 bar.

As also shown in FIG. 3C, a next step may include removing the dissolved developed block 142 (FIG. 3B) to form nano-structure 170. Developed block 142 is shown as completely removed (open area 162) for simplicity. It should be recognized, however, that developed block 142 does not have to be removed from block copolymer 144 to reveal pattern 160.

Figure 4:
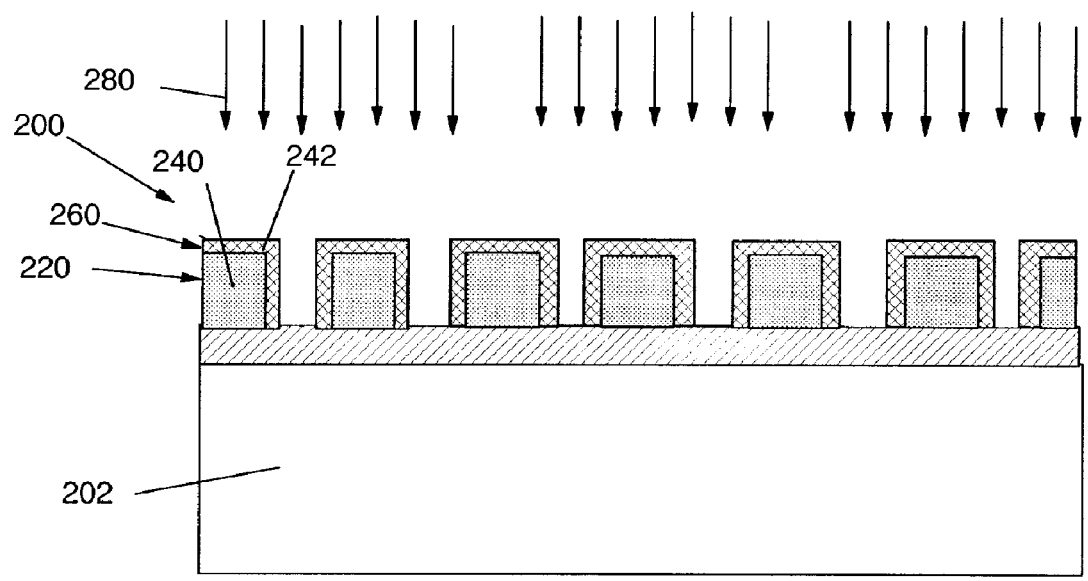
FIG. 4 shows an alternative step for the method of FIGS. 3A-C.

Referring to FIG. 4, a nano-structure 200 is illustrated over a substrate 202. Nano-structure 200 includes diblock copolymer film 220 after development, but without a developed block 242 (actually surrounds block 240) removed. The method of forming nano-structure 200 includes the same steps shown in FIGS. 3A-3B. However, block copolymer 220 is annealed with heat and without actinic irradiation allowing for phase separation of the immiscible polymer blocks. Next, block copolymer 220 is developed using a polar supercritical solvent (not shown) to form a pattern 260 having an insoluble block 240 and a soluble block 242 that is commensurate with the positioning of one of the blocks in block copolymer 220. As shown, soluble block 242 is covalently bound to insoluble block 240.

Figure 5:
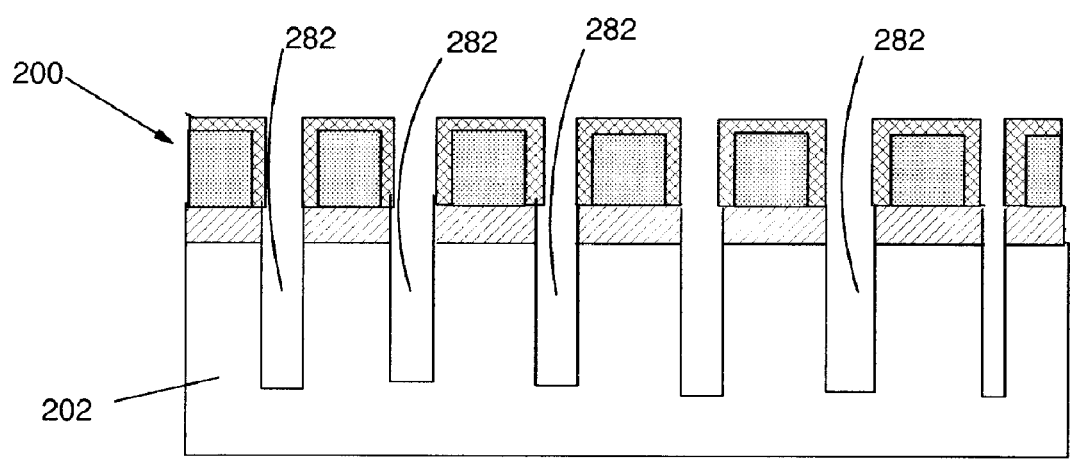
FIG. 5 shows an alternative step for the method of FIGS. 3A-C and 4.

Turning to FIG. 5, an optional step for either embodiment described above (shown only for the FIG. 4 embodiment) may include transferring a pattern 260 of nano-structure 200 (block copolymer) into underlying substrate 202, for example, via an etch 280 to create openings 282. The transfer renders the substrate porous, i.e., the porosity is caused by the transfer of the pattern similarly to the porosity described in US Patent Application Publication No. 20040127001. Openings 282 can be used to form semiconductor devices, semiconductor interconnects, micro fluidic arrays, micro-fuel cell or any substrate requiring a nano-perforated film known to those skilled in the art. Nano-structure 200 can be removed once openings 282 are completed.

The above-described methods allow development of a block copolymer and removal of a selected portion (developed block 142) adjacent to a substrate 100. Where substrate 100 is in the form of a dielectric layer, e.g., a porous dielectric, the methods allow removal of a selected portion without physically damaging the dielectric, as shown in FIG. 4.

Figure 6:
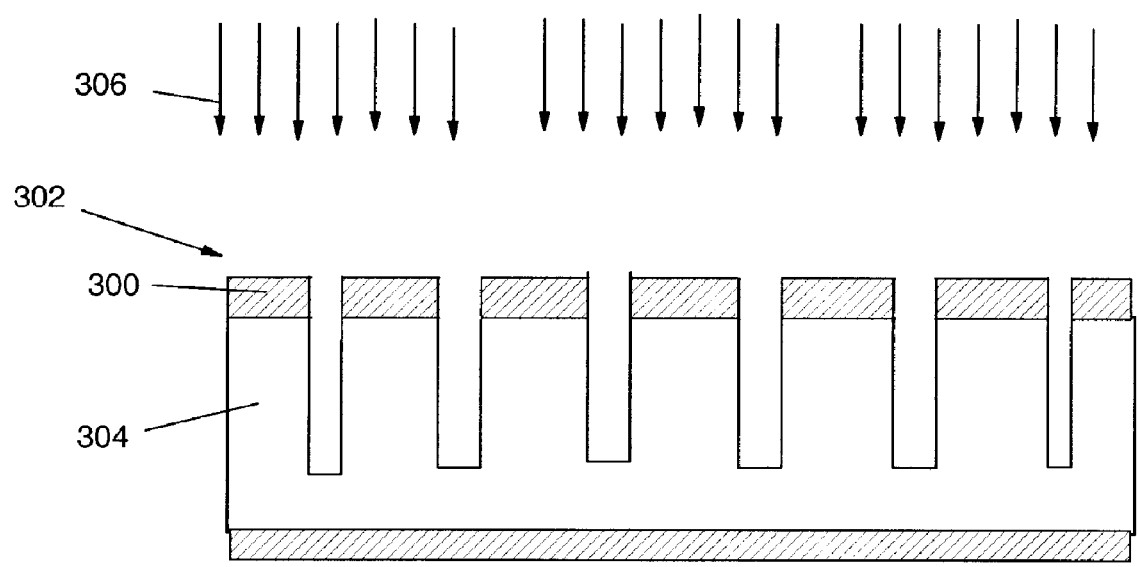
FIG. 6 shows a method of removing a PMMA-b-S-based resist according to the invention.

Turning to FIG. 6, the invention also includes a method of removing a poly(methyl methacrylate-b-styrene) (PMMA-b-S)-based resist 300 from a partially fabricated semiconductor device 302 having PMMA-b-S-based resist 300 thereon. PMMA-b-S-based resist 300 can be provided, as shown in FIG. 5, as nano-structure 200 or as a typical resist layer, as shown in FIG. 6. The method includes providing partially fabricated semiconductor device 302 including a dielectric 304 and having PMMA-b-S-based resist 300 over at least a portion of the partially fabricated semiconductor device, and using a polar supercritical solvent 306 to remove PMMA-B-S-based resist 300. As in earlier embodiments, polar supercritical solvent 306 may include at least one of: chlorodifluoromethane, methylene chloride, 1,1 dichloroehylene, ethylene dichloride, chloroform, 1,1 dichloroethane, trichloroethylene, chlorobenzene, O-dichlorobenzene, tetrahydrofuran, dibenzyl ether, acetone, methyl ethyl ketone, cyclohexanone, diethyl ketone, acetophenone, methyl isoamyl ketone, isophorone, methyl acetate, ethyl formate, ethyl acetate, diethyl carbonate, diethyl sulfate, 2-ethoxyethyl acetate, 2-nitropropane, nitrobenzene, pyridine, morpholine, analine, N-methyl-2-phyrrolidone and cyclohexylamine. In one preferred embodiment, polar supercritical solvent 306 includes chlorodifluoromethane. In this case, the exposing step preferably occurs at a temperature of greater than approximately 96.4° C. and a pressure greater than approximately 48.5 bars. Polar supercritical solvent 306 may also contain an optional co-solvent such as ethanol or methanol. In one embodiment, this step may include using supercritical carbon dioxide ($CO_2$) as a carrier for the polar supercritical solvent 306, but this is not necessary. The method allows for removal of PMMA-b-S-based resist 300 without damaging porous dielectric 304.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of removing a select portion of a block copolymer, the method comprising the steps of:
    exposing the block copolymer to a polar supercritical solvent to dissolve the select portion of the block copolymer, wherein the block copolymer includes a block polystyrene and poly(methyl methacrylate b-styrene) copolymer; and
    removing the dissolved portion of the block copolymer.

2. The method of claim 1, wherein the block copolymer includes a diblock copolymer.

3. The method of claim 1, wherein the exposing step includes using supercritical carbon dioxide ($CO_2$) as a carrier for the polar supercritical solvent.

4. The method of claim 1, wherein the exposing step includes exposing in an environment at a temperature of no less than approximately 31° C. and no greater than approximately 80° C., and a pressure of no less than approximately 200 bar and no greater than approximately 300 bar.

5. The method of claim 1, wherein the polar supercritical solvent includes at least one of: chlorodifluoromethane, methylene chloride, 1,1 dichloroehylene, ethylene dichloride, chloroform, 1,1 dichloroethane, trichloroethylene, chlorobenzene, O-dichlorobenzene, tetrahydrofuran, dibenzyl ether, acetone, methyl ethyl ketone, cyclohexanone, diethyl ketone, acetophenone, methyl isoamyl ketone, isophorone, methyl acetate, ethyl formate, ethyl acetate, diethyl carbonate, diethyl sulfate, 2-ethoxyethyl acetate, 2-nitropropane, nitrobenzene, pyridine, morpholine, analine, N-methyl-2-phyrrolidone and cyclohexylamine.

6. The method of claim 1, further comprising the step of tuning the polar supercritical solvent to dissolve a select region of the block copolymer.

7. The method of claim 1, wherein a portion of the block copolymer is crosslinked.

8. The method of claim 1, wherein the polar supercritical solvent includes chlorodifluoromethane at a temperature of greater than approximately 96.4° C. and a pressure greater than approximately 48.5 bar.

9. The method of claim 1, wherein the removing step includes removing only a portion of the block copolymer from the block copolymer film.

10. The method of claim 1, wherein the removing step includes removing the block copolymer adjacent to a dielectric.

11. The method of claim 1, further comprising the step of transferring a pattern of the block copolymer into an underlying substrate.

12. The method of claim 11, wherein the transferring step renders the substrate porous.

* * * * *